United States Patent [19]

Clemens

[11] Patent Number: 4,520,326
[45] Date of Patent: May 28, 1985

[54] SINGLE-STAGE OSCILLATOR HAVING LOW-IMPEDANCE FEEDBACK PORT

[75] Inventor: Thomas G. Clemens, Glassboro, N.J.

[73] Assignee: General Instrument Corporation, New York, N.Y.

[21] Appl. No.: 435,883

[22] Filed: Oct. 21, 1982

[51] Int. Cl.³ .......................... H03B 5/36; H03C 3/22
[52] U.S. Cl. .......................... 331/116 R; 331/177 V; 332/16 T; 332/30 V
[58] Field of Search ........ 331/116 R, 116 FE, 117 R, 331/117 FE, 36 C, 177 V, 158, 160; 332/30 V, 16 T

[56] References Cited

U.S. PATENT DOCUMENTS

| 3,378,790 | 4/1968 | Bray | 331/116 R |
| 3,543,186 | 11/1970 | Flaig | 331/116 R |
| 3,728,480 | 4/1973 | Baer | 331/116 R X |

OTHER PUBLICATIONS

Doyle, "A Comparison of Solid State Sub-Carrier Oscillators for Color TV Receivers", IEEE Transactions on Broadcast and Television Receivers, Feb. 1970, pp. 37-42.

Primary Examiner—Siegfried H. Grimm
Attorney, Agent, or Firm—Hopgood, Calimafde, Kalil, Blaustein & Judlowe

[57] ABSTRACT

A single-crystal oscillator comprising a single transistor and a capacitor divider connected in a feedback path, which includes the crystal input and output ports, between the collector and base of the transistor, thereby to provide a low-impedance input port to the crystal. The impedance of the crystal output port, which is connected to the base of the transistor, is also low. As a result of the low crystal input and output port impedances, the oscillator is capable of operating without any significant levels of spurious crystal frequencies, and can be switched between crystal and voltage-controlled modes of operation without frequency pull or lock-up to the crystal when operating in the voltage-controlled mode.

12 Claims, 5 Drawing Figures

SINGLE-STAGE OSCILLATOR HAVING LOW-IMPEDANCE FEEDBACK PORT

The present invention relates generally to oscillators, and more particularly to a low-impedance-port, single-stage oscillator.

Crystal oscillators have long been in use as sources of stable and accurate frequencies in many and varied applications. One problem that has long been associated with crystal oscillators is the tendency of certain crystals to produce undesirable or spurious harmonic frequencies from secondary cuts of the crystal. It is also a common practice to selectively operate a crystal oscillator as a voltage-controlled crystal oscillator in which the frequency of oscillation is varied by means of the application of a frequency control voltage to a variable capacitance device or varactor which is connected in the circuit.

When the frequency produced in the known voltage-controlled oscillator operating in its voltage-controlled mode nears the crystal frequency, the oscillator frequency tends to "pull" or lock-up at the crystal frequency. In the past this has required either the use of separate crystal and voltage-controlled oscillators, or the operation of the voltage-controlled oscillator at a frequency offset from that of the crystal and the use of a secondary mixer to correct for the frequency offset used to avoid the frequency lock-up. Each of these options, however, requires the use of additional circuitry and components, which add to the cost and complexity of the circuit.

It has been found that one way to avoid both spurious crystal overtone frequencies as well as frequency pull or lock-up in the voltage-controlled oscillator mode is to provide low impedances at the crystal input and output ports. In the past, relatively low impedances have been achieved at the input and output ports in an oscillator circuit called a Butler oscillator, which requires the use of at least two active devices, such as transistors. In the Butler oscillator, the crystal input and output ports are respectively connected to the low-impedance emitter circuits of the two transistors. The need for two transistors in the Butler oscillator, however, increases the cost of the circuit and has limited its acceptance and use, particularly in those commercial applications, such as in phase-lock loops of cable television headend frequency converters, in which cost is an important consideration.

It is an object of the present invention to provide a low-impedance port crystal oscillator which employs only a single active stage of amplification.

It is a further object of the present invention to provide a crystal oscillator in which spurious overtone frequencies that may be produced by the crystal are significantly dampened.

It is another object of the invention to provide a crystal oscillator capable of operating in the voltage-controlled oscillator mode without frequency pull or lock-up.

It is an additional object of the invention to provide a crystal oscillator of the type described which operates effectively with crystals cut for overtone frequencies as well as with crystals cut for fundamental frequency operation.

It is yet a further object of the present invention to provide an oscillator of the type described which can be switched between the crystal mode and voltage-controlled mode of operation through the use of relatively low diode-switching voltages.

The oscillator of the invention includes a single transistor and a capacitor divider connected in a feedback path, which includes the crystal input and output ports, between the collector and base of the transistor, thereby to provide a low-impedance input port to the crystal. The impedance of the crystal output port, which is connected to the base of the transistor, is also low. As a result of the low crystal input and output port impedances, the oscillator is capable of operating without any significant levels of spurious crystal frequencies, and can be switched between crystal and voltage-controlled modes of operation without frequency pull or lock-up to the crystal when operating in the voltage-controlled mode.

To the accomplishment of the above and such further objects as may hereinafter appear, the present invention relates to a single-stage crystal oscillator, substantially as defined in the appended claims and as described in the following specification, as considered with the accompanying drawings in which:

Figure 1:
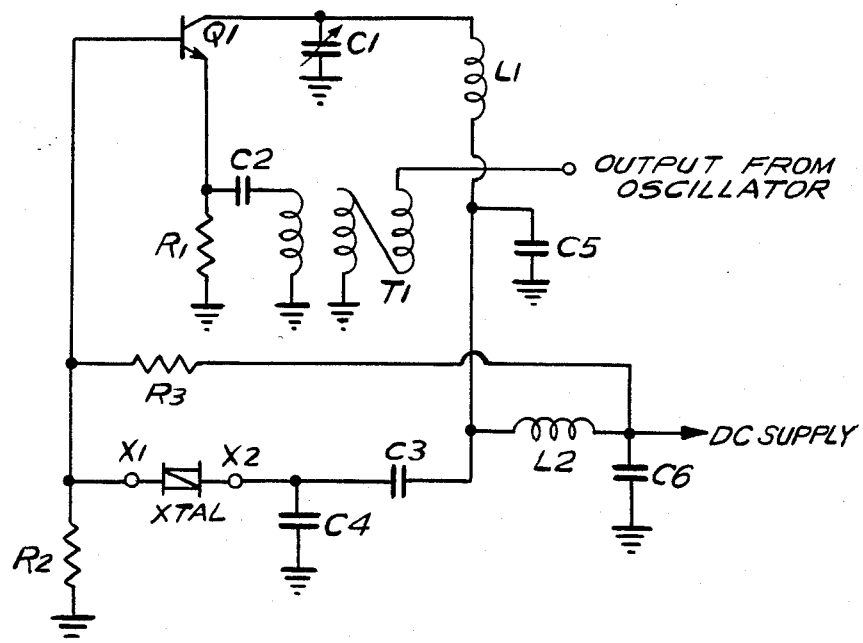
FIG. 1 is a schematic circuit diagram of the crystal oscillator of the invention.

The basic oscillator circuit of FIG. 1 includes a single transistor Q1. A variable capacitor C1 connected between the collector of transistor Q1 and ground and an inductance L1 connected to the collector of the transistor constitute a resonant circuit selected to tune the collector circuit to the desired oscillator frequency. The emitter of transistor Q1 is connected to ground through a resistor R1 and through a coupling capacitor C2 to an output transformer T1 to the oscillator output. The base of transistor Q1 is connected to a DC supply voltage through a resistive voltage divider made up of resistors R2 and R3. The base of the transistor is also connected to crystal output port X1 connected to the junction of resistors R2 and R3.

The inductance L1 is also connected to a feedback capacitor divider comprised of capacitors C3 and C4, the latter of which is also connected to ground; the common node of the capacitor divider is also connected to the crystal input port X2. A crystal XTAL producing oscillation in the desired frequency range is connected between input and output ports X2 and X1. The feedback voltage division provided by capacitors C3 and C4 remains substantially constant over the desired frequency range of the oscillator to provide a constant and sufficient crystal excitation. A bypass capacitor C5 is connected to ground and to inductance L1, and a filter comprised of a RF choke L2 and a bypass capacitor C6 is connected in the DC supply line.

The values of the components in the circuit of FIG. 1 are selected according to the following criteria:

Transistor Q1—selected for operating polarity, voltage, and current requirement with a minimum power gain of 10 at the highest operating frequency.

Inductance L1—selected to resonate with capacitor C1 over the desired frequency range or with the overall circuit capacitance if it is to be tuned.

RF choke L2—selected for spurious series resonant-free operation over the desired frequency range and a minimum impedance of 1,000 ohms at the lowest operating frequency.

Capacitor C1—selected for required capacitance change to cover the desired frequency range; may be deleted if inductance L1 is to be tuned.

Capacitor C2—selected to provide an impedance of approximately 50 ohms at the lowest operating frequency. Capacitor C2 in conjunction with the primary inductance of transformer T1 provides controlled emitter bypassing to compensate for gain change over the frequency range and also provides output load variation isolation.

Capacitor C3—selected so that it presents an impedance less than 5 ohms at the lowest operating frequency.

Capacitor C4—selected to present an impedance of approximately 50 ohms at the lowest operating frequency.

Capacitor C5—selected to present an impedance of less than 10 ohms at 20 times the lowest operating frequency.

Capacitor C6—selected to present an impedance less than 1 ohm at 20 times the lowest operating frequency.

Resistor R1—selected for required output voltage and temperature variation stability.

Resistor R2—selected in conjunction with other input circuit values and the emitter-base resistance of transistor Q1 to provide an excitation output port impedance at approximately 5 times the input port impedance at the lowest operating frequency.

Resistor R3—selected for correct operating conditions of transistor Q1 in conjunction with resistor R2 as a voltage divider.

Transformer T1—designed for 1:2 ratio, 50 ohms to 100 ohms over the operating frequency range to provide coupling isolation in conjunction with capacitor C2 to external circuitry.

By the proper selection of these components, and particularly the values of capacitors C3 and C4, a low impedance in the order of 50 ohms or less is obtained at both the crystal output and input ports X1 and X2. The collector resonant circuit comprised of capacitor C1 and inductance L1 is tuned so as to resonate at the desired frequency of the crystal, which may be in the order of 1 mHz to 100 mHz, which thus becomes the frequency of the signal produced at the oscillator output. The low impedances established at the crystal input and output ports serve to substantially dampen all unwanted higher harmonics or spurious frequencies produced by the crystal.

The crystal XTAL in the circuit of FIG. 1 can be replaced by a RC-series circuit or other frequency-determining circuit or element connected between the low-impedance ports X1 and X2. The parameters of this circuit or element are selected to provide the desired range of frequency of oscillation.

Figure 2:
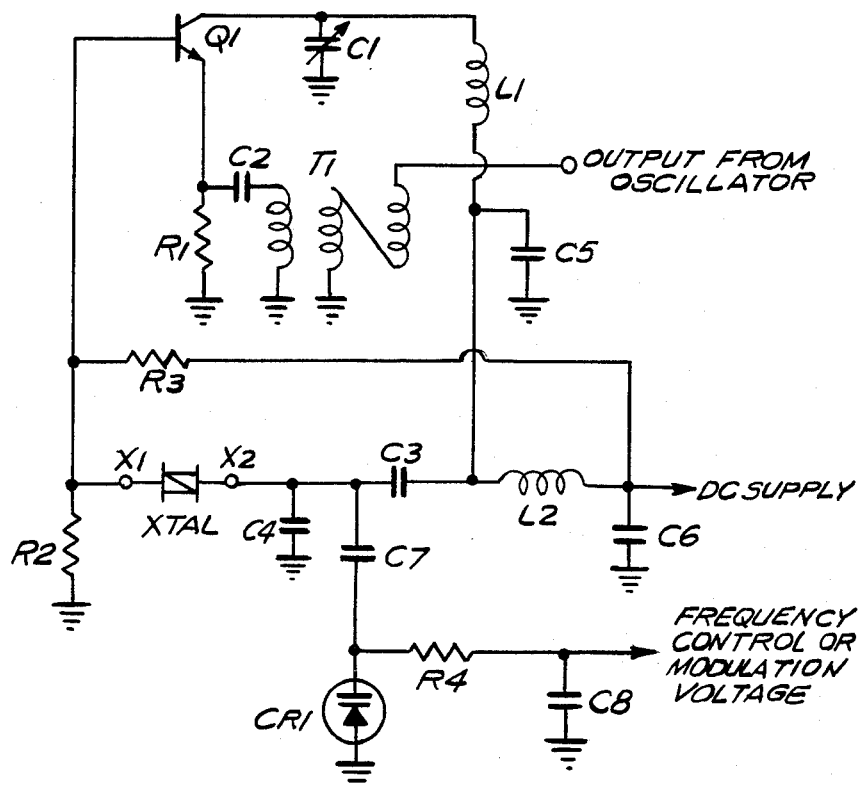
FIG. 2 is a schematic circuit diagram of the oscillator of the invention which is capable of operating as a voltage-controlled crystal oscillator.

The circuit of FIG. 2 is a variation of the oscillator circuit of FIG. 1 capable of operating in the voltage-controlled crystal (VCOX) mode. Similar components in the circuit of FIG. 2 to those in the circuit of FIG. 1 are designated by reference terms corresponding to those used in FIG. 1. The oscillator circuit of FIG. 2 further includes a voltage-controlled variable-capacitance diode or varactor CR1 connected through a capacitor C7 to the crystal input port X2. The other side of capacitor C7 is connected to the junction of capacitors C3 and C4. The cathode of varactor CR1 is connected through a resistor R4 to a D.C. frequency control voltage, which can be varied, for example, between 1 and 15 volts, to, in turn, vary the capacitance of varactor CR1 between 2 and 18 pf. A bypass capacitor C8 is connected between the control voltage line and ground, and the anode of varactor CR1 is also connected to ground.

In a typical application of the circuit of FIG. 2, a frequency shift of ±500 kHz may be achieved in the nominal output frequency of the oscillator of 100 mHz by applying a frequency-control or modulation voltage to the varactor CR1 so as to modify the capacitance of the varactor and thereby bring about the desired frequency shift of the oscillator or to modulate the oscillator output.

Figure 3:
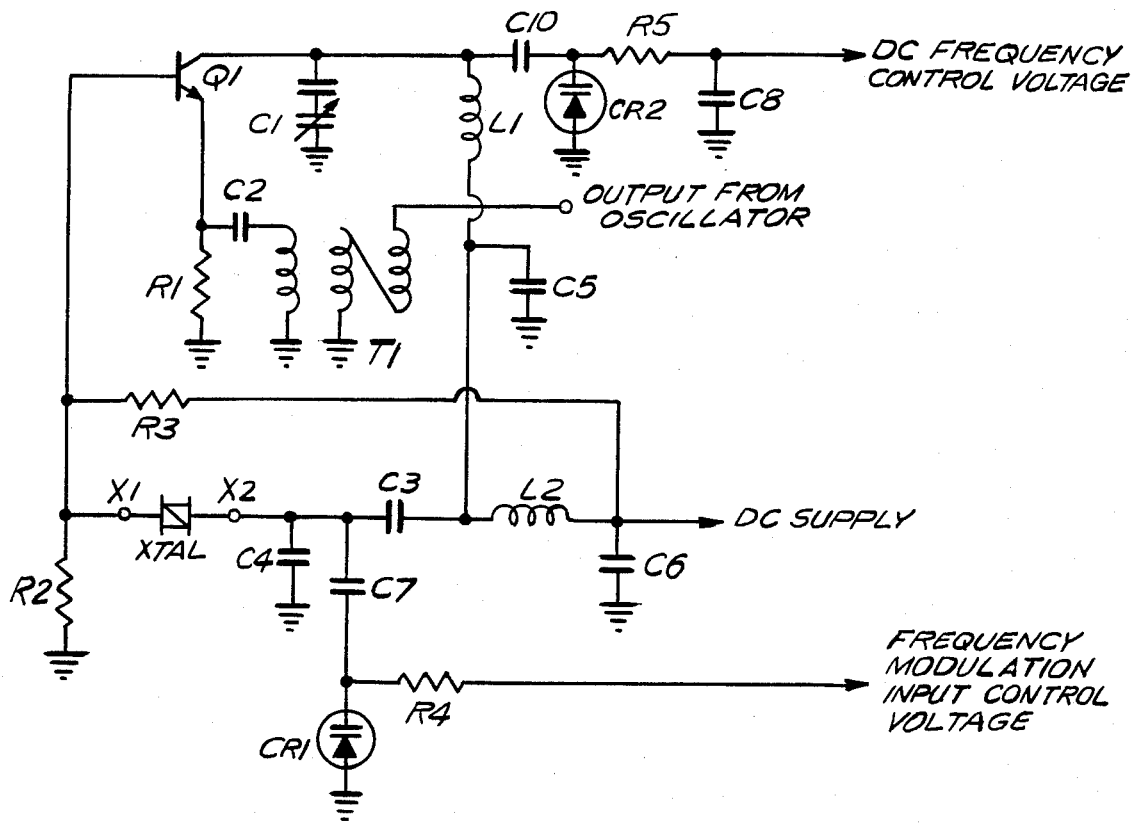
FIG. 3 is a variation of the circuit of FIG. 2, which allows for frequency control and modulation.

In the circuit illustrated in FIG. 3, a wider frequency shift may be achieved by the inclusion of a second variable-capacitance diode or varactor CR2 into the frequency-determining circuit along with the crystal and varactor CR1 which may be included in the oscillator when it is desired to frequency modulate the oscillator output. Varactor CR2 is connected to the collector of transistor Q1 through a capacitor C10, and to the variable D.C. frequency-control voltage through a resistor R5 and the bypass capacitor C8. As in the previous emobodiment, the application of a control voltage to varactor CR2 varies the capacitance of the varactor to bring about the described control of the oscillator frequency.

Figure 3A:
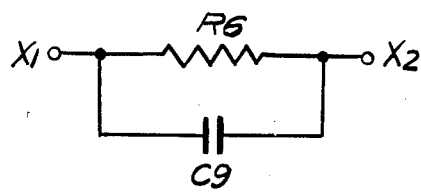
FIG. 3A shows the use of an RC network substituted for the crystal of the oscillator of FIG. 3.

If it is desired to operate the oscillator of FIG. 3 as a voltage-controlled oscillator (VCO), the crystal XTAL may be replaced by the RC network consisting of a resistor R6 and a capacitor C9 as illustrated in FIG. 3A. Frequency tuning of greater than 2:1 may be achieved in this version of the circuit.

Figure 4:
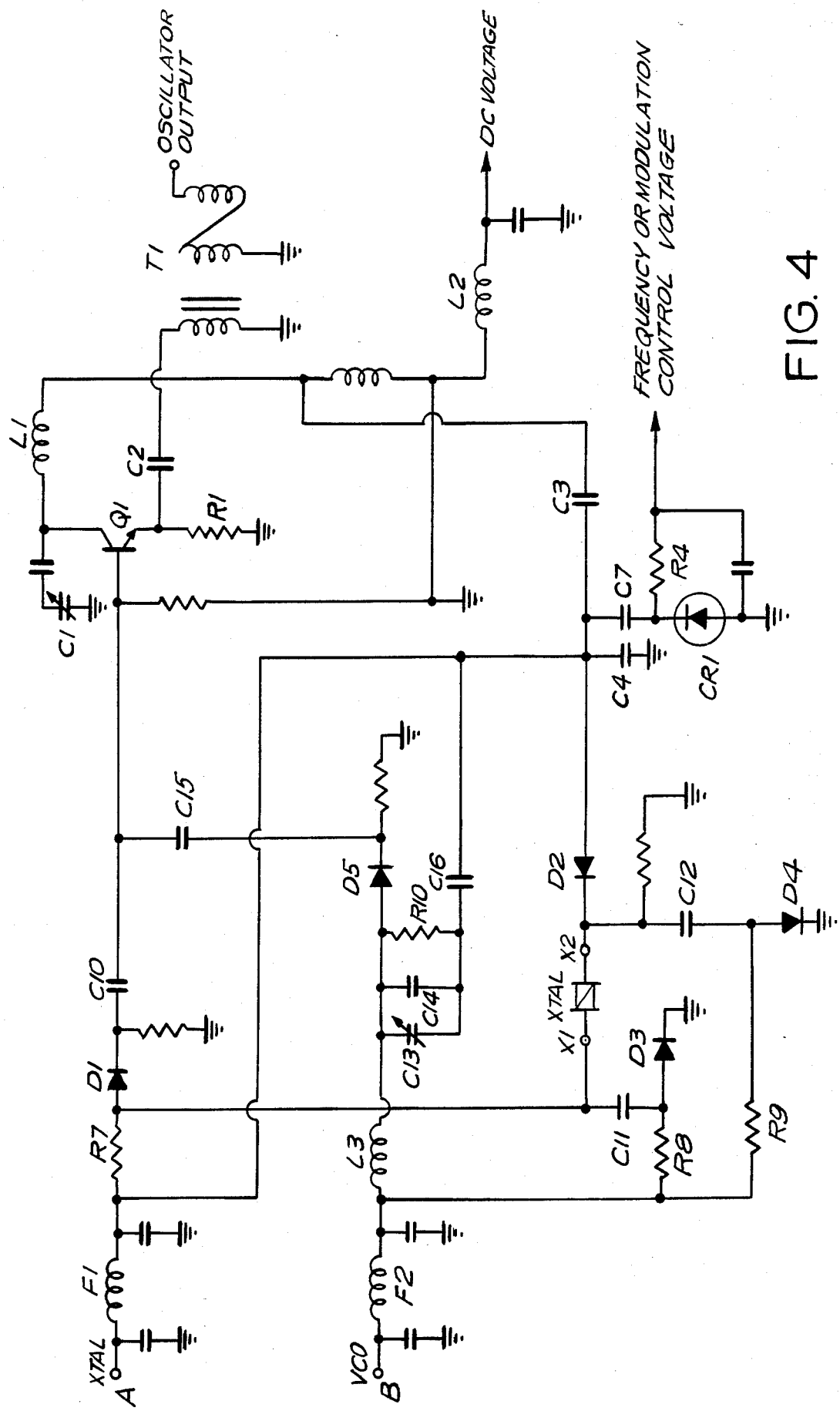
FIG. 4 is a schematic circuit diagram of the oscillator of the invention capable of being switched between the voltage-controlled oscillator and voltage-controlled crystal oscillator modes of operation.

The oscillator circuit of FIG. 4 is operable in a crystal oscillator (XTAL) mode or voltage-controlled crystal (VCOX) mode or in a voltage-controlled oscillator (VCO) mode through the selective application of a low-voltage XTAL or VCO control signal to control terminals A and B, respectively. The circuit of FIG. 4 includes a diode D1, the anode of which is connected through an LC filter F1 and a resistor R7 to control terminal A. The cathode of diode D1 is connected through a capacitor C10 to the base of transistor Q1. The anode of diode D1 is also connected to one side of the crystal XTAL. The other side of the crystal is connected to the cathode of a diode D2, the anode of which is also connected through filter F1 to terminal A. The anode of diode D1 is also connected through a capacitor C11 to the anode of a diode D3, the cathode of which is grounded. The anode of diode D3 is also connected through a resistor R8 and an LC filter F2 to VCO control terminal B. The crystal and the cathode of diode D2 are connected through a capacitor C12 to the anode of a diode D4, the cathode of which is grounded. The anode of diode D4 is connected through a resistor R9 and through filter F2 to terminal B. Input terminal B is connected through filter F2 and an inductance L3 to an RC tuning or resonant circuit consisting of a variable tuning capacitor C13, a capacitor C14 and a resistor R10 connected in parallel, and to the anode of a diode D5. The cathode of diode D5 is connected through a capacitor C15 to the base of transistor Q1. The RC resonant circuit is also connected through a capacitor C16 and resistor R7 to the anode of diode D1.

To operate the circuit of FIG. 4 in either the XTAL or VCOX mode, a control voltage of a relatively low level, in the order of 3 volts DC, is applied to terminal A. This voltage causes diodes D1 and D2 to be conductive and the crystal is thereby placed in the feedback path of the oscillator. In the VCO mode of operation of the circuit of FIG. 4, a VCO control voltage applied to terminal B causes diodes D1 and D2 to be nonconductive and diodes D3, D4 and D5 to be conductive. The conduction through diodes D3 and D4 creates an A.C. ground at both ends of the crystal and places the RC resonant circuit made up of capacitors C13 and C14 and resistor R10 in the feedback path of the oscillator at the same insertion loss and gain as the crystal, which is removed from the feedback path during this VCO operation. The capacitive divider made up of capacitors C3 and C4 is connected between the collector circuit of the transistor and the input port of the crystal and the parallel resonant circuit, whichever is operative as the frequency-determining element of the circuit, depending on its mode of operation. During operation of the circuit in the XTAL mode, the voltage applied to varactor CR1 is maintained constant. In the VCOX or VCO mode the capacitance of varactor CR1 connected between capacitor C4 and ground is varied by the application of a tuning voltage, which further varies the frequency of the oscillator by modifying the parameters of the frequency-determining circuit. In the VCOX mode, a variation of ±10 percent of the crystal frequency can be achieved in the oscillator output frequency, whereas in the VCO mode a greater variation in the oscillator output frequency can be achieved.

Crystal lockup is prevented in the circuit of FIG. 4 by the switching diodes D2 and D3 AC grounding the crystal while opening the crystal from the circuit during VCO operation. The low input-output crystal port impedances achieved by the capacitive divider made up of capacitors C3 and C4 permits the diodes D1–D5 to be switched on and off by the relatively low control voltages applied to either terminal A or terminal B, and also prevents the switching diode leakage capacitance from providing sufficient feedback voltage for operation.

It will be appreciated from the foregoing description that the oscillator circuit of the invention provides both low impedances at the crystal feedback input and output ports. The low port impedances provide oscillator performance which is free of spurious overtones, and allows the oscillator to operate from fundamental to overtone crystal cuts without modification and by the use of switching diodes operating at a low voltage. In addition, the oscillator can be diode switched between crystal and tuned voltage-controlled operation without lock-up on the crystal frequency when tuning is near the same frequency, and a near constant output voltage is provided in the oscillator over a wide tuning range without secondary control circuitry, AGC, or the like.

It will also be appreciated that whereas the oscillator of the present invention has been described with respect to several embodiments, modifications may be made to those embodiments without necessarily departing from the spirit and scope of the invention.

What is claimed is:

1. An oscillator circuit comprising a transistor, a tuning circuit connected to the collector of said transistor, an output node operatively connected to the emitter of said transistor, input and output ports connected to a frequency-determining element, and means for establishing a relatively low impedance at at least one of said input and output ports, said last-mentioned means including a capacitive divider comprising a first capacitor connected between the collector of said transistor and said one of said input and output ports and a second capacitor operatively connected to said first capacitor and to a reference potential, the other of said input and output ports being operatively connected to the base of said transistor, the impedance of said first capacitor being less than 5 ohms at the lowest oscillator operating frequency, and the impedance of said second capacitor being approximately 50 ohms at the lowest operating frequency.

2. The oscillator circuit of claim 1, wherein said frequency determining element comprises a crystal connected to said input and output ports.

3. The oscillator circuit of claim 2, further comprising first and second switching terminals, a frequency-determining circuit, and first and second diode means respectively connected to said first and second terminals and to said crystal and frequency-determining circuit, a control voltage when present on said first terminal being effective to place said first and second diode means in a first conductive state, thereby to connect said crystal as the frequency-determining element of the circuit, and a control voltage, when present, on said second terminal being effective to place said first and second diode means in a second conductive state, thereby to connect said frequency-determining circuit as the frequency-determining element of the circuit.

4. The oscillator circuit of claim 1, in which said first capacitor is operatively connected between the collector of said transistor and said input port.

5. The oscillator of claim 1, in which the voltage division provided by said first and second capacitors is substantially constant over the frequency range of the oscillator.

6. The oscillator circuit of claim 5, wherein said frequency-determining element comprises a crystal connected to said input and output ports.

7. The oscillator circuit of claim 5, further comprising a voltage-controlled variable capacitor operatively connected to said capacitive divider, and a control voltage line operatively connected to one terminal of said voltage-controlled capacitor.

8. The oscillator circuit of claim 7, further comprising a second voltage-controlled variable capacitor operatively connected to the collector of said transistor and to said voltage control line.

9. An oscillator circuit comprising an amplifying stage having an input and an output, an input port and an output port across which a frequency-determining element is connected, the input of said amplifying stage being operatively connected to said output port, and means for establishing a low impedance at said input port, said last-mentioned means including a capacitive divider comprising a first capacitor operatively connected between the output of said amplifying stage and said input port and a second capacitor connected between said first capacitor and a reference potential, the values of said first and second capacitors being selected such that the voltage division provided by said first and second capacitors is substantially the same over the frequency range of the oscillator, the impedance of said first capacitor being less than 5 ohms at the lowest oscillator operating frequency, and the impedance of said second capacitor being approximately 50 ohms at the lowest operating frequency.

10. The oscillator circuit of claim 9, wherein said frequency-determining element comprises a crystal connected to said input and output ports.

11. An oscillator circuit comprising a transistor, a tuning circuit connected to the collector of said transistor, an output node operatively connected to the emitter of said transistor, input and output ports connected to a frequency-determining element, means for establishing a relatively low impedance at at least one of said input and output ports, said last-mentioned means including a capacitive divider comprising a first capacitor connected between the collector of said transistor and said one of said input and output ports and a second capacitor operatively connected to said first capacitor and to a reference potential, the other of said input and output ports being operatively connected to the base of said transistor, a voltage-controlled variable capacitor operatively connected to said capacitive divider, and a control voltage line operatively connected to one terminal of said voltage-controlled capacitor.

12. The oscillator circuit of claim 11, further comprising a second voltage-controlled variable capacitor operatively connected to the collector of said transistor and to said voltage control line.

* * * * *